United States Patent
Lipka

(10) Patent No.: US 7,834,697 B1
(45) Date of Patent: Nov. 16, 2010

(54) DIFFERENTIAL LOW FREQUENCY NOISE SUPPRESSION TECHNIQUE FOR A COMMON MODE FEEDBACK CIRCUIT

(75) Inventor: Ronald J. Lipka, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/476,132

(22) Filed: Jun. 1, 2009

(51) Int. Cl.
*H03F 3/45* (2006.01)
(52) U.S. Cl. ...................... 330/258; 330/149
(58) Field of Classification Search ............... 330/258, 330/253–254, 85, 291, 149
See application file for complete search history.

(56) References Cited

U.S. PATENT DOCUMENTS 7,071,780 B2 * 7/2006 Van Zanten ............ 330/258
7,733,179 B2 * 6/2010 Forejt .................. 330/258

OTHER PUBLICATIONS

U.S. Appl. No. 12/465,521, filed May 13, 2009, 2009, by Ronald J. Lipka.
"A Frequency Compensation Scheme for LDO Voltage Regulators" Chava, Chaitanya K. and Silva-Martinez, Jose, IEEE Transactions on Circuits & Systems, vol. 51, No. 6, Jun. 2004.

* cited by examiner

*Primary Examiner*—Robert Pascal
*Assistant Examiner*—Hieu P Nguyen
(74) *Attorney, Agent, or Firm*—William W. Cochran; Cochran Freund & Young LLC

(57) ABSTRACT

Disclosed is a common mode feedback circuit for a differential amplifier that eliminates the effects of low frequency noise. A modulator is placed in a common mode feedback loop that modulates the feedback loop signal at a predetermined frequency to up-convert the low frequency noise. The predetermined frequency may be selected to be above the operating range of the downstream circuitry. In addition, a low pass filter can be used to eliminate the up-converted noise.

7 Claims, 2 Drawing Sheets

US 7,834,697 B1

DIFFERENTIAL LOW FREQUENCY NOISE SUPPRESSION TECHNIQUE FOR A COMMON MODE FEEDBACK CIRCUIT

BACKGROUND OF THE INVENTION

Common mode noise generated by a differential amplifier can be eliminated by subtracting the differential signals. The derived signal is substantially devoid of induced differential noise. As such, differential amplifiers are a useful analog circuit for eliminating differential noise.

SUMMARY OF THE INVENTION

An embodiment of the present invention may therefore comprise a method of up-converting low frequency differential mode noise generated in a common mode feedback circuit comprising: generating differential voltage signals at an output of the differential amplifier, the output having a positive voltage output and a negative voltage output; connecting a first side of a first resistor to the positive voltage output of the differential amplifier; connecting a first side of a second resistor to the negative voltage output of the differential amplifier; providing a transconductance amplifier that has a positive input and a negative input and that generates a common mode output current signal on both a first output and a second output; applying a common mode voltage of the differential amplifier to the negative input of the transconductance amplifier by connecting the negative input of the transconductance amplifier to the second side of the first resistor and a second side of the second resistor; up-converting the low frequency noise by modulating the common mode output current signal at a predetermined frequency which up-converts the low frequency noise to the predetermined frequency.

An embodiment of the present invention may further comprise a common mode feedback circuit that up-converts low frequency noise to a predetermined frequency comprising: a differential amplifier that generates differential voltage signals on a positive output and a negative output; a first resistor having a first side that is connected to the positive output of the differential amplifier; a second resistor having a first side that is connected to the negative output of the differential amplifier; a transconductance amplifier that generates a common mode output signal on both a first output and a second output, the transconductance amplifier having negative input that is connected to a second side of the first resistor and a second side of the second resistor so that a common mode voltage of the difference voltage signals of the differential amplifier is connected to the negative input of the transconductance amplifier, the transconductance amplifier having a positive input that is connected to a reference voltage so that the common mode voltage is compared to the reference voltage and the common mode output current signal of the transconductance amplifier is representative of the difference between the common mode voltage and the reference voltage; a modulator having an input that is connected to the first output and the second output of the transconductance amplifier that modulates the common mode output current signal generated by the transconductance amplifier at the predetermined frequency and up-converts noise on the first output and the second output of the transconductance amplifier to the predetermined frequency.

DETAILED DESCRIPTION OF THE EMBODIMENTS

Figure 1:
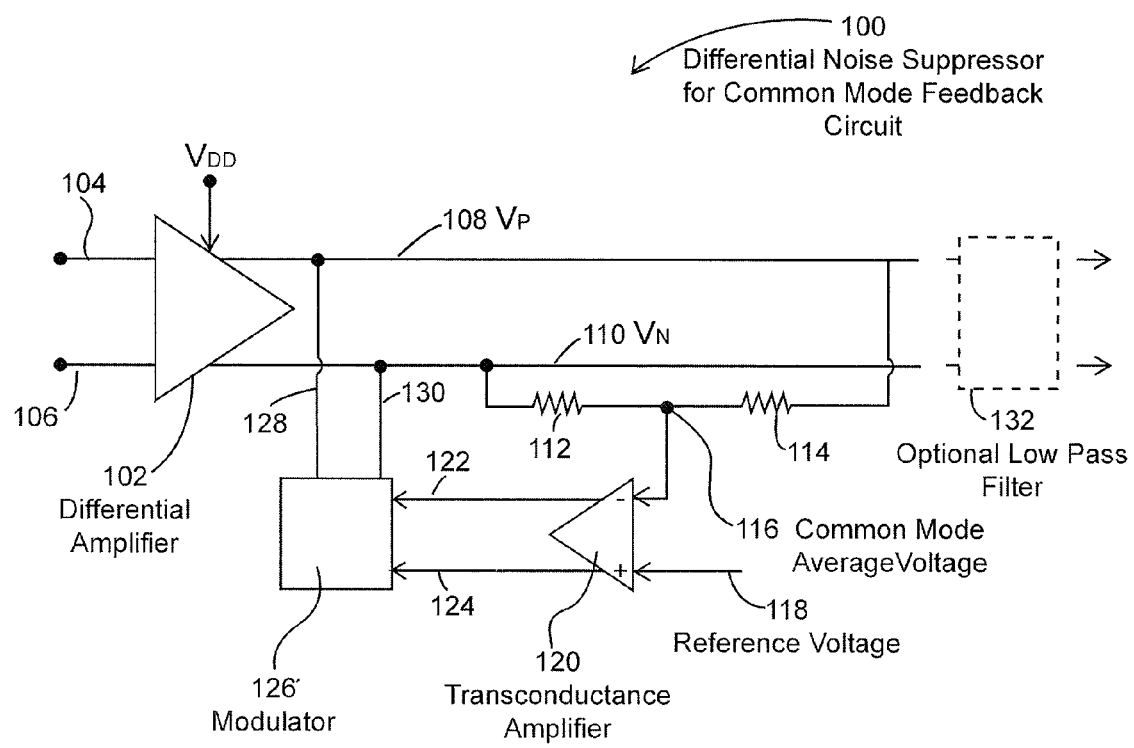
FIG. 1 is an overall block diagram of an embodiment of a differential noise suppressor for a common mode feedback circuit of a differential amplifier.

FIG. 1 is a schematic block diagram of a differential noise suppressor for a common mode feedback circuit 100 that is used with a differential amplifier 102. As shown in FIG. 1, inputs 104, 106 are applied to differential amplifier 102. Differential amplifier 102 generates a differential output on a positive output voltage line 108 and a negative output voltage line 110. The outputs 108, 110 of differential amplifier 102 are connected to a feedback circuit that comprises resistors 112, 114, transconductance amplifier 120, and modulator 126. The feedback loop controls the common mode voltage level of outputs 108, 110 of differential amplifier 102. Resistors 112, 114 have the same resistance, so that node 116 comprises the common mode voltage, since node 116 is a summing node. The common mode voltage is applied to the negative input of the transconductance amplifier 120, while a reference voltage 118 is applied to the positive input of the transconductance amplifier 120. The outputs 122, 124 of the transconductance amplifier 120 comprise a common mode signal that is duplicated on outputs 122, 124 that is representative of the difference between the common mode voltage 116 and the reference voltage 118.

Various types of noise can be present on the outputs 108, 110 of the differential amplifier 102. For example, common mode noise, which appears on both output 108 and output 110 can be eliminated by generating a difference signal from outputs 108, 110. However, other types of noise may randomly occur on one or the other of the outputs 108, 110. A typical type of noise that occurs is low frequency noise resulting from the use of certain types of components, such as CMOS components. This type of noise is typically referred to as 1/f noise. 1/f noise typically increases in amplitude for lower frequency signals. Hence, in low frequency applications of a differential amplifier, such as differential amplifier 102, 1/f noise can be a factor. The differential 1/f noise that is generated by the differential amplifier 102 cannot be removed by generating a difference signal from the outputs 108, 110. In addition, transconductance amplifier 120 may also generate 1/f low frequency noise, which is injected into the outputs 108, 110 of the differential amplifier 102. The differential amp 102 by itself removes common mode noise only. Embodiments of the present invention function to suppress the 1/f differential mode noise being generated from the common mode feedback circuit.

As also shown in FIG. 1, modulator 126 modulates the common mode signal at outputs 122, 124 of the transconductance amplifier 120 at a predetermined frequency. The modulated current signals 128, 130 are applied to outputs 108, 110, respectively, of the differential amplifier 102 to complete the feedback circuit. In this fashion, the differential output signals 108, 110 are controlled to produce a common mode voltage at node 116 that is equal to the reference voltage 118.

Modulator 126, illustrated in FIG. 1, has a modulation frequency that up-converts the 1/f low frequency noise to a higher frequency that is equal to the modulation frequency plus the frequency of the low frequency noise. The 1/f noise is double sideband (i.e. a 1/f noise at a single frequency has a component at +1/f and −1/f) so the modulation operation produces signals at the modulation frequency + and − the noise frequency. In this fashion, the low frequency noise can be band-shifted to a higher frequency, so that the low frequency noise does not affect a particular application that is within a lower frequency band of interest. In addition, an optional low pass filter 132 can be used to filter out the noise and only pass the lower frequency signal. This may be particularly useful in audio circuits that have a frequency range from just several Hertz up to 20 KHz. In this manner, low frequency 1/f noise from the common mode feedback circuit can be virtually eliminated from an audio or other low frequency circuit. Hence, in one embodiment, the modulation frequency may be a frequency above 20 KHz, which is the top of the audio range. Similarly, the low pass filter 132 in the described embodiment may have a cutoff frequency of approximately 20 KHz, so that the low pass filter passes all signals below the 20 KHz cutoff.

One of the problems with using a modulator 126, as illustrated in FIG. 1, is that switching noise may be induced in the modulated output signals 128, 130 at high switching frequencies. Hence, application of the feedback circuit 100, illustrated in FIG. 1, may be less useful at high frequencies unless quiet switching devices and/or low pass filter 132 can be used.

Figure 2:
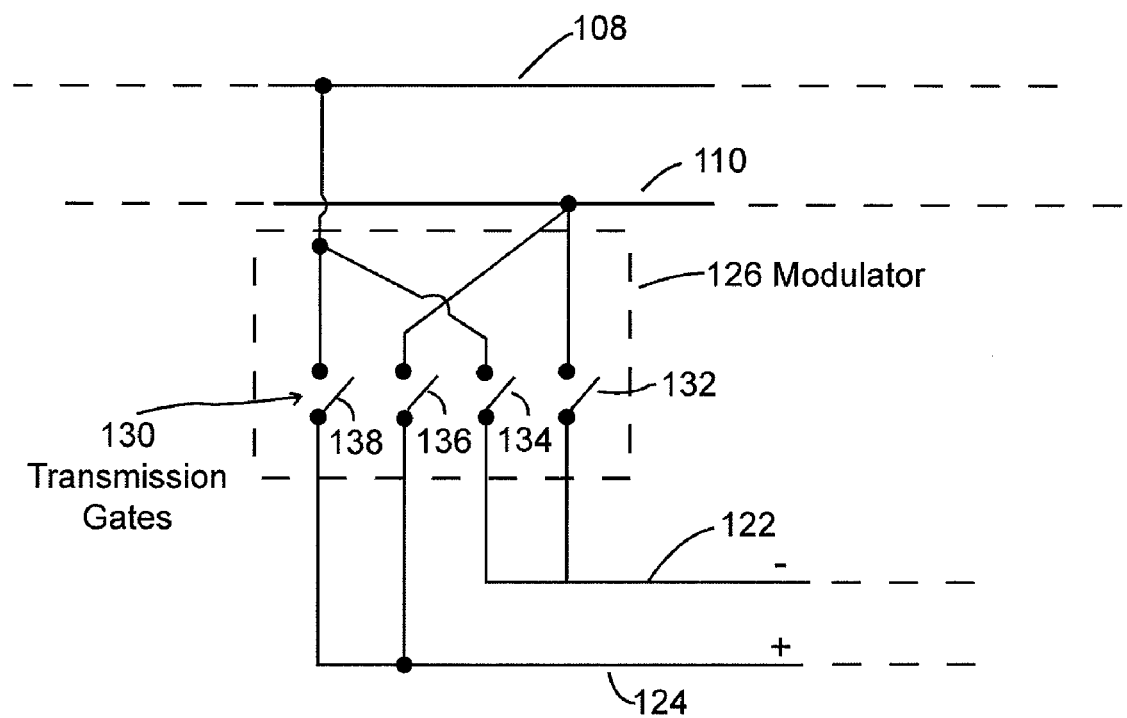
FIG. 2 is a schematic diagram of the modulator circuit illustrated in FIG. 1.

FIG. 2 is a schematic illustration of the modulator 126 that is illustrated in FIG. 1. As shown in FIG. 2, transmission gates 132, 134, 136, 138 are controlled by a modulation signal that switches the transmission gates 132, 138 to either a connected position or a disconnected position. During a first time period, transmission gate 132 and transmission gate 138 are connected, while transmission gate 134 and transmission gate 136 are disconnected. During a second equal time period, transmission gates 134, 136 are connected, while transmission gates 132, 138 are disconnected. This results in the common mode output current signal 122, 124 from the transconductance amplifier 120 being alternatively connected to outputs 108, 110 at a fifty percent duty cycle. Again, the modulation frequency is sufficiently high to up-convert the low frequency noise to a frequency that does not impact the circuits downstream from the differential amplifier 102.

Hence, the common mode feedback loop, illustrated in the embodiments of FIGS. 1 and 2, up-converts low frequency noise to a frequency that does not affect downstream circuitry. In addition, the low frequency noise can be filtered by a low pass filter to eliminate the noise from the output of the differential amplifier. This process results in the generation of a highly desirable output signal with little or no 1/f noise from the common mode feedback circuit.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of up-converting low frequency differential mode noise generated in a common mode feedback circuit comprising:
   generating differential voltage signals at an output of said differential amplifier, said output having a positive voltage output and a negative voltage output;
   connecting a first side of a first resistor to said positive voltage output of said differential amplifier;
   connecting a first side of a second resistor to said negative voltage output of said differential amplifier;
   providing a transconductance amplifier that has a positive input and a negative input and that generates a common mode output current signal on both a first output and a second output;
   applying a common mode voltage of said differential amplifier to said negative input of said transconductance amplifier by connecting said negative input of said transconductance amplifier to said second side of said first resistor and a second side of said second resistor;
   up-converting said low frequency noise by modulating said common mode output current signal at a predetermined frequency which up-converts said low frequency noise to said predetermined frequency.

2. The method of claim 1 wherein said process of providing a transconductance amplifier further comprises:
   providing a transconductance amplifier that compares said common mode voltage to a reference voltage to maintain a voltage level of said common mode voltage.

3. The method of claim 2 wherein said process of up-converting said low frequency noise comprises:
   modulating said common mode output current signal generated by said transconductance amplifier with four transmission gates that swap polarity of said first output and said second output of said transconductance amplifier at said predetermined frequency and with a duty cycle of approximately fifty percent.

4. The method of claim 3 further comprising:
   low pass filtering said differential voltage signals generated by said differential amplifier to remove said low frequency noise that has been up-converted.

5. A common mode feedback circuit that up-converts low frequency noise to a predetermined frequency comprising:
   a differential amplifier that generates differential voltage signals on a positive output and a negative output;
   a first resistor having a first side that is connected to said positive output of said differential amplifier;
   a second resistor having a first side that is connected to said negative output of said differential amplifier;
   a transconductance amplifier that generates a common mode output signal on both a first output and a second output, said transconductance amplifier having negative input that is connected to a second side of said first resistor and a second side of said second resistor so that a common mode voltage of said difference voltage signals of said differential amplifier is connected to said negative input of said transconductance amplifier, said transconductance amplifier having a positive input that is connected to a reference voltage so that said common mode voltage is compared to said reference voltage and said common mode output current signal of said transconductance amplifier is representative of the difference between said common mode voltage and said reference voltage;
   a modulator having an input that is connected to said first output and said second output of said transconductance amplifier that modulates said common mode output current signal generated by said transconductance amplifier at said predetermined frequency and up-converts noise on said first output and said second output of said transconductance amplifier to said predetermined frequency.

6. The circuit of claim 5 wherein said modulator comprises:
   four transmission gates that swap polarity of said first output and said second output of said transconductance amplifier at said predetermined frequency with a duty cycle of approximately fifty percent.

7. The circuit of claim 6 further comprising:
   a low pass filter connected to said differential voltage signals generated by said differential amplifier to filter out said low frequency noise.

* * * * *